Sept. 5, 1961 D. RANDISE 2,999,174

SWEEP GENERATOR

Filed Jan. 30, 1959

INVENTOR
DOMINICK RANDISE
BY *Henry Huff*
ATTORNEY

United States Patent Office 2,999,174
Patented Sept. 5, 1961

2,999,174

SWEEP GENERATOR

Dominick Randise, Huntington Station, N.Y., assignor to Sperry Rand Corporation, Great Neck, N.Y., a corporation of Delaware Filed Jan. 30, 1959, Ser. No. 790,159
3 Claims. (Cl. 307—88.5)

The present invention relates to sweep waveform generators and, more particularly, concerns a linear sweep generator of the Miller-feedback type.

A principal object of the present invention is to provide a sweep generator adapted to produce an output waveform having good linearity and reduced fly-back time.

Another object of the invention is to provide a sweep circuit characterized by minimum stand-by power consumption.

An additional object is to provide a gated sweep voltage generator suitable for transistorization and adapted to produce an output sweep voltage which is substantially unaffected by the amplitude of the gating signal.

These and other objects of the present invention as will appear from a reading of the following specification are accomplished in a preferred embodiment by the provision of first and second transistors connected in cascode arrangement, each transistor having a base, collector and emitter electrode. One of the transistors is employed as an electronic switch; the other transistor is utilized as a signal amplifying device. A capacitor is connected between the base and collector electrodes of the transistor amplifier through the collector and emitter circuit of the transistor switch, the emitter of the transistor switch being directly connected to the collector of the transistor amplifier. The base of the transistor amplifier and the collector of the transistor switch are each returned to a source of voltage by respective resistors. The emitter of the transistor amplifier is connected to ground.

A bi-valued input gating signal is applied between the base of the transistor switch and ground, one of said values of the gating signal rendering the transistor switch nonconductive. Upon the nonconduction of the transistor switch, the capacitor rapidly charges substantially to the potential of the voltage source. When the input gating signal amplitude assumes its other value, the transistor switch is rendered conductive thereby permitting the discharge of the capacitor, the discharge proceeding linearly under the influence of the Miller-feedback effect.

Figure 1:
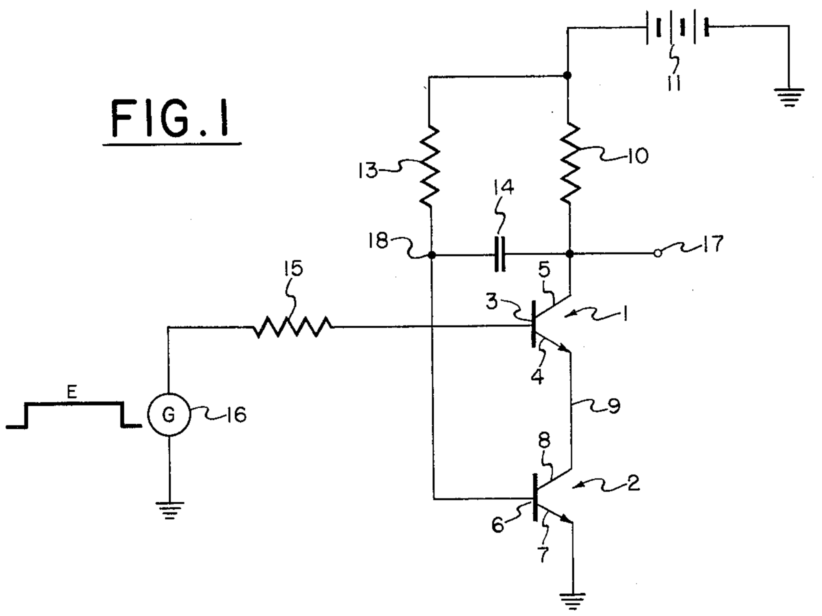
Figure 2:
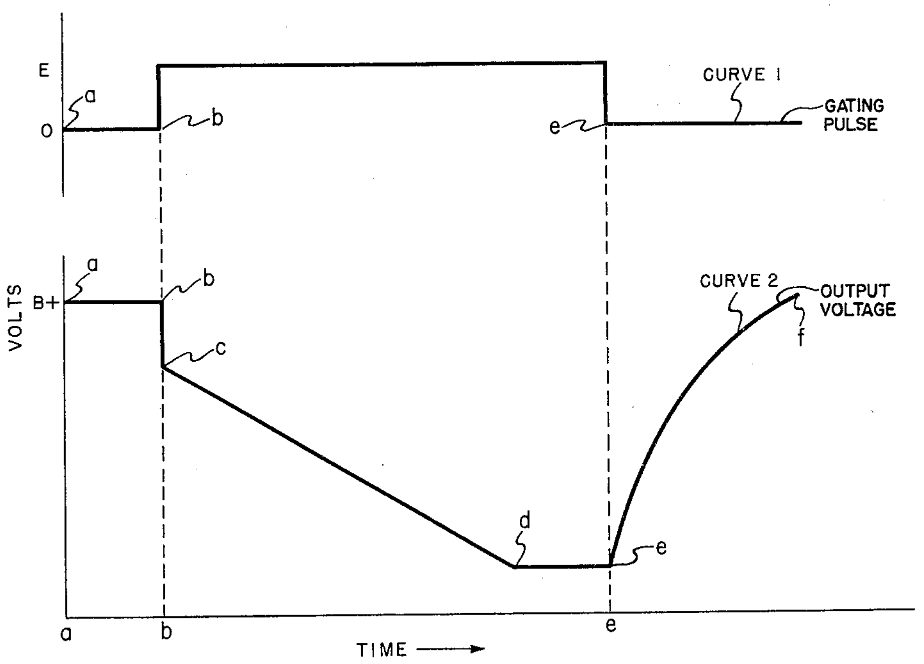

For a more complete understanding of the present invention reference should be had to the following description and to the appended drawings of which:

FIG. 1 is a schematic diagram of a preferred embodiment of the present invention; and FIG. 2 is a series of idealized waveforms useful in explaining the operation of the apparatus of FIG. 1.

Referring to FIG. 1, transistors 1 and 2 are connected in cascode with the emitter 4 of transistor 1 being connected directly to the collector 8 of transistor 2. Emitter 7 of transistor 2 is grounded. The collector 5 of transistor 1 is coupled to a source of potential 11 through resistor 10. Base 6 of transistor 2 is connected to source 11 through resistor 13. Source 11 is shown with its negative terminal grounded in order to properly bias the indicated NPN transistors 1 and 2 toward conduction. Collector 5 of transistor 1 is coupled by capacitor 14 to base 6 of transistor 2. A source of binary-valued gating signal, generally represented by the numeral 16, is applied via resistor 15 between the base 3 of transistor 1 and ground.

Referring to the idealized waveforms of FIG. 2, which are plots of voltage amplitude versus time, curve 1 represents the gating waveform which is applied to the base 3 of transistor 1. The initial lower level, occurring between points *a* and *b*, renders transistor 1 nonconductive.

Inasmuch as the current path of collector 8 of transistor 2 is in series circuit with nonconductive transistor 1, no current flows through the collector of transistor 2. It should be noted, however, that transistor 2 is placed in a quiescent condition tending toward the conduction of collector current by virtue of its grounded emitter 7 and positively biased base 6.

The positive potential of source 11 which is applied to base 6 of transistor 2 through resistor 13 causes the flow of base current between base 6 and grounded emitter 7. A conductive path thus being established between ground and point 18, capacitor 14 begins to charge through resistor 10 toward the potential of source 11. The potential ultimately resulting across capacitor 14 is substantially equal to the potential of source 11.

Transistor 1 is rendered fully conductive at point *b* of curve 1 of FIG. 2 when the gating waveform abruptly assumes its upper value E. The conduction of transistor 1 simultaneously completes the collector current path of transistor 2, permitting the flow of current through collector 8 of transistor 2.

Curve 2 of FIG. 2 depicts the signal waveform appearing at output terminal 17 which is connected to collector 5 of transistor 1. The potential at output terminal 17 is substantially equal to the potential of capacitor 14 with respect to ground. As previously described, the potential at capacitor 14 is substantially equal to that of source 11 during the time intervening points *a* and *b* of curve 1. Accordingly, the potential of the output waveform appearing at terminal 17 is depicted as equaling the potential of source 11 (B+) during the same time interval. Upon the simultaneous conduction of transistors 1 and 2 at point *b* of curve 1, the potential at output terminal 17 abruptly falls to point *c* of curve 2 because of the rapid decrease in the potential between base 6 of transistor 2 and ground when transistor 2 conducts. The potential across capacitor 14 remains fixed at time *b*.

When point *c* of curve 2 is reached, capacitor 14 begins to discharge through resistor 13 resulting in an increasing positive potential at the base 6 of transistor 2. The resulting increased current flowing through the collector 8 of transistor 2 causes a further decrease in the potential at terminal 17. As a result of the well known Miller-effect, the discharge of capacitor 14 proceeds at a substantially linear rate producing a corresponding linearly decreasing potential at output terminal 17 as represented by the straight line portion of curve 2 between points *c* and *d*.

Point *d* of curve 2 corresponds to the collector current saturation of transistor 2 finally produced by the linearly increasing potential applied to base 6. The minimum voltage obtaining at terminal 17 during the time interval *d* to *e* of curve 2 is determined by the sum of the collector-to-emitter potential drops across saturated transistors 1 and 2 connected in series circuit with respect to ground.

When point *e* of curves 1 and 2 is reached, the amplitude of the gating waveform reverts to its initial value at which transistor 1 it cut off. The consequent disruption of the collector current path of transistor 2 permits the relatively rapid recharging of capacitor 14 to the potential of source 11 through resistor 10. An important feature of the present invention is that by disrupting the Miller feedback path upon the nonconduction of transistor 1, the rate at which capacitor 14 recharges is limited solely by the magnitude of resistor 10. It has been observed that the recharging time interval of capacitor 14 is substantially lengthened for given values of capacitor 14 and resistor 10, when transistor 2 remains operative during such recharging interval.

The deactuation of transistor 2 except during the sweep-producing time interval between points *c* and *d* limits the quiescent dissipation of power to the relatively small amount attributable to the flow of base current through transistor 2. This flow of base current is not objectionable, however, for the reason that transistor 2 is thus placed in readiness for immediate high gain collector current flow upon the conduction of transistor 1. The instantly available high gain of transistor 2 is instrumental in enhancing the Miller-effect linear discharge of capacitor 14 subsequent to the conduction of transistor 1. The result is that a substantially linear sweep voltage is produced at output terminal 17.

It should be noted that transistor 1 functions primarily as an electronic switch which either completes or disrupts the collector current path of transistor 2 depending on the amplitude of the gating signal applied to base 3. Accordingly, transistor 1 may be replaced by any switch such as, for example, a vacuum tube or a relay having a state of conduction controllable by an input gating signal. Moreover, although a transistor is utilized in the preferred embodiment to FIG. 1 as the gain-producing element 2 of the sweep generator, a vacuum tube will also provide the desired function. Accordingly, the term "electron device," as used in the appended claims, is intended to include both transistors and vacuum tubes.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A sweep generator comprising an electron device having a collecting electrode, a control electrode, and an emitting electrode, a two terminal source of potential, said emitting electrode being connected to one of said terminals, a two terminal impedance means, one of said impedance terminals being connected to the other of said potential terminals, actuable switching means for selectively connecting when actuated the other of said impedance terminals to said collecting electrode, a source of gating signals, means for applying said gating signal to said switching means for the actuation thereof, a resistor connecting said control electrode to said other of said potential terminals, and a capacitor, one terminal of which is connected to said other of said impedance terminals and the other terminal of which is connected solely to said control electrode.

2. Apparatus as defined in claim 1 wherein said electron device is a transistor having a base, collector and emitter, said base corresponding to said control electrode, said collector corresponding to said collecting electrode, and said emitter corresponding to said emitting electrode.

3. A sweep generator comprising first and second transistors each having a base, collector and emitter, the emitter of said first transistor being connected to the collector of said second transistor, a two terminal source of potential, said emitter of said second transistor being connected to one of said potential terminals, two terminal impedance means, one of said impedance terminals being connected to the other of said potential terminals, and the other of said impedance terminals being connected to said collector of said first transistor, a resistor connected between said base of said second transistor and said other of said potential terminals, a capacitor one terminal of which is connected to said collector of said first transistor and the other terminal of which is connected solely to said base of said second transistor, and a binary-valued gating signal source coupled between said base of said first transistor and said emitter of said second transistor, one of the values of said gating signal rendering the emitter-to-collector current path of said first transistor conductive and the other value of said gating signal rendering the emitter-to-collector current path of said first transistor nonconductive.

References Cited in the file of this patent

UNITED STATES PATENTS

| | | |
|---|---|---|
| 2,891,173 | Helbig | June 16, 1959 |

FOREIGN PATENTS

| | | |
|---|---|---|
| 762,526 | Great Britain | Nov. 28, 1956 |

OTHER REFERENCES

Pulse and Digital Circuits, Millman and Taub, published 1956 by McGraw-Hill, New York, pages 217 to 235.